(12) United States Patent
Hauenstein et al.

(10) Patent No.: US 7,121,721 B2
(45) Date of Patent: Oct. 17, 2006

(54) APPARATUS AND METHOD FOR MEASURING OPERATING TEMPERATURES OF AN ELECTRICAL COMPONENT

(75) Inventors: Henning Hauenstein, Reutlingen (DE); Markus Baur, Rottenburg (DE)

(73) Assignee: Robert Bosch GmbH, Stuttgart (DE)

( * ) Notice: Subject to any disclaimer, the term of this patent is extended or adjusted under 35 U.S.C. 154(b) by 32 days.

(21) Appl. No.: 10/481,761

(22) PCT Filed: Jun. 18, 2002

(86) PCT No.: PCT/DE02/02210

§ 371 (c)(1),
(2), (4) Date: May 27, 2004

(87) PCT Pub. No.: WO03/005442

PCT Pub. Date: Jan. 16, 2003

(65) Prior Publication Data
US 2004/0208227 A1  Oct. 21, 2004

(30) Foreign Application Priority Data
Jul. 4, 2001 (DE) ................................ 101 32 452

(51) Int. Cl.
*G01K 7/00* (2006.01)
(52) U.S. Cl. .................................................. 374/178
(58) Field of Classification Search .................... None
See application file for complete search history.

(56) References Cited

U.S. PATENT DOCUMENTS

| | | | |
|---|---|---|---|
| 3,942,030 A * | 3/1976 | Olsen et al. ............... 307/117 |
| 5,401,099 A | 3/1995 | Nishizawa et al. | |
| 6,326,792 B1 * | 12/2001 | Okada ........................ 324/456 |
| 6,700,428 B1 * | 3/2004 | Sander ........................ 327/312 |
| 6,953,281 B1 * | 10/2005 | Hauenstein ................. 374/161 |
| 2005/0104613 A1 * | 5/2005 | Duvvury et al. ............. 324/765 |

FOREIGN PATENT DOCUMENTS

| | | | |
|---|---|---|---|
| DE | 4104376 A1 * | 8/1992 |
| DE | 196 52 046 | 6/1998 |
| JP | 63021763 A * | 1/1988 |
| JP | 03186775 A * | 8/1991 |

OTHER PUBLICATIONS

Tailliet, F. et al., "Characterization of a N-P-N Structure under ESD Stress and Proposed Electrical Model," IEEE Transactions on Electron Devices, IEEE Inc. New York, US, Bd. 37, No. 4, Apr. 1, 1990, pp. 1111-1120.

"Design '88-Optimized Sipmos Power Transistors," Components, Siemens Aktiengesellschaft, München, Germany, Bd. 23, No. 4, Sep. 1, 1988, p. 170.

* cited by examiner

*Primary Examiner*—Diego Gutierrez
*Assistant Examiner*—Mirellys Jagan
(74) *Attorney, Agent, or Firm*—Kenyon & Kenyon LLP

(57) ABSTRACT

An apparatus and a method for measuring operating temperatures $T_j$ of a component, particularly transient temperatures $T_j$ in the breakdown region of the component 2 during a breakdown operation, are provided. The component temperature $T_j$ at a point of time $t_i$ is ascertainable from a measurement of the breakdown voltage $U_d$ and the breakdown current I of the component 2 at the specific point of time $t_i$ during the breakdown operation using a measuring device, by comparing the measurement data to reference measurement data recorded in advance.

7 Claims, 2 Drawing Sheets

APPARATUS AND METHOD FOR MEASURING OPERATING TEMPERATURES OF AN ELECTRICAL COMPONENT

FIELD OF THE INVENTION

The present invention relates to an apparatus and a method for measuring operating temperatures of an electrical component, e.g., transient temperatures of the component during breakdown operation.

BACKGROUND INFORMATION

In general, in the field of semiconductor technology, the performance of a component is strongly dependent, inter alia, on the permissible operating temperatures. A very common reason for component failure is temperatures which are too high during operation, which damage or even completely destroy the component. Both for the user who dimensions a specific application, and for the semiconductor manufacturer that specifies its product, the knowledge of the component temperature that result under specific field conditions is therefore of great interest.

Thus, the problem of detecting the component temperature, particularly transient changes of temperature in the interior of the component during operation, is important.

At the moment, the following approach to solving this problem is found in the prior art. The so-called barrier-layer temperature or junction temperature $T_j$ is determined via the measurement of the forward voltage of p-n junctions of the component. The p-n junctions are junctions between p-doped and n-doped regions of a semiconductor, and they are, for example, a component of rectifier and Zener diodes, or exist in the form of the intrinsic body diode of a field-effect transistor or MOSFET transistor.

This known approach utilizes the fact that the voltage, which must be applied in the forward direction to a p-n junction for a specific current flow, is a function of the component temperature at the location of the p-n junction. Based on the functional correlation of the voltage, of the current and the component temperature, by measuring the forward voltage with respect to a given forward current, it is possible to infer the component temperature.

In the known approach above, the fact that the measurement current must flow in the forward direction across the component turns out to be disadvantageous, i.e., this method is not usable as long as another operating state of the component prevents this forward current. Even during such operating states, however, it is often necessary to exactly determine the internal temperature conditions of the component.

For example, using this known method, it is not possible to examine the reverse breakdown of a diode, in which a high voltage is applied in the reverse direction, such that the diode breaks down and a high so-called avalanche current flows in the reverse direction. The high fields and currents lead to strong heating of the component, the hottest location in the component being precisely at the p-n junction which is breaking down. However, to determine the temperature prevailing at the p-n junction using the approach described above, it is necessary to wait until the reverse current has nearly completely decayed, in order to be able to allow a measurement current to flow in the forward direction through the component. This time delay results in an inaccurate measurement, since the temperature now present no longer corresponds to the temperature peak at the p-n junction occurring during the breakdown, because in the meantime, the heat has already been distributed over a larger area of the component or to the thermally coupled surroundings of the component.

However, it is precisely the transient temperature peaks which are critical in damaging the component and which cannot be measured sufficiently accurately using the above approach according to the prior art.

SUMMARY

The present invention provides the advantage that the peak temperatures occurring during critical operating states and their variation with time may be exactly detected during breakdown operation of the semiconductor component.

The present invention utilizes the fact that the breakdown voltage and the breakdown current of the component are measured at a specific point of time during the breakdown operation using a measuring device, and the component temperature at this point of time is ascertained by comparing these measured values to previously recorded reference measurement data of the connection between the breakdown voltage and the breakdown current.

Therefore, the barrier-layer temperature may be measured directly during the breakdown operation, and its characteristic may be tracked on a time scale during the active component operation. The operation is not impaired by the detection of the breakdown voltage. Moreover, the transient internal component temperature is measured, which is relatively independent of external influences due to the mounting of the component.

Furthermore, the real-time data of the temperature variation of the component with time may be utilized directly for calibrating numerical model calculations. A subsequent extrapolation of temperature values measured with time delay is therefore no longer necessary.

Because the temperature measurement is more precise, developers are able to verify and optimize their theory/simulation models and calibrate certain parameters. The specification of the semiconductor products may also be safeguarded or verified by direct transient measurement data.

Finally, the application developers are able to test the load of the used components directly in the circuit during the active breakdown operation. It is thereby possible to better take advantage of the so-called safe operating range of the component for the application, since the limits of permissible thermal operating parameters are directly discernible.

In addition, the method according to the present invention may be used on packaged and unpackaged components, and it may also be used for repeating switching operations, e.g., for repetitive avalanche breakdowns, since the method itself takes up no more time than the avalanche-operation itself, i.e., there is no dead time between the individual measurements, and therefore no additional measuring time for the component.

According to one exemplary embodiment of the present invention, the component is designed as a semiconductor component capable of electrical breakdown, having at least one p-n junction. For example, the component takes the form of a transistor, e.g., a MOSFET transistor or bipolar transistor, or a diode, e.g., a Zener diode.

According to another exemplary embodiment of the present invention, the component is designed as a component capable of tunnel breakdown, having an insulating layer, e.g., a gate oxide layer, between two conductor layers.

In a further exemplary embodiment of the present invention, the electrical storage device of the apparatus takes the form of an inductor.

In another exemplary embodiment of the present invention, the switching device of the apparatus is designed as a MOSFET switch.

In a further exemplary embodiment of the present invention, the component is designed as a MOSFET transistor that is usable at the same time as a switching device.

According to a further exemplary embodiment, the measuring device for measuring the breakdown voltage and the breakdown current of the component at a specific point of time during the breakdown operation is designed as an oscilloscope.

According to another exemplary embodiment, the apparatus additionally has an evaluation unit which, from the measured voltage characteristic and current characteristic, automatically ascertains the associated barrier-layer temperature characteristic of the component.

In another exemplary embodiment, reference measurement data are recorded in a steady-state manner as a calibration curve at predetermined component temperatures, the predetermined component temperatures being suitably selected for the relevant component in such a way that during later breakdown operation, the measured value of the barrier-layer temperature may be determined with a predetermined accuracy.

In a further exemplary embodiment for the recording of reference measurement data, the component is brought homogeneously to a predetermined temperature by a heating/cooling device.

In one further exemplary embodiment, reference measurement data are recorded immediately after the electrical breakdown of the component.

DETAILED DESCRIPTION

Figure 1:
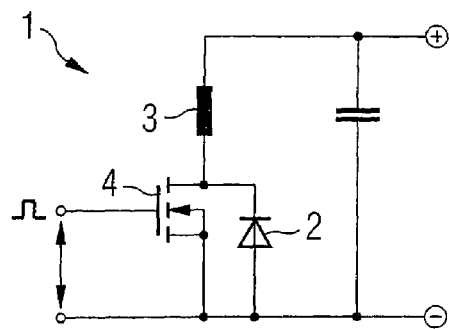
FIG. 1 is a circuit diagram of an apparatus for measuring barrier-layer temperatures $T_j$ of a component capable of electrical breakdown according to an exemplary embodiment of the present invention.

In the figures, the same reference numerals denote the same or functionally equivalent components. FIG. 1 illustrates a circuit diagram of an apparatus 1 for measuring operating temperatures, particularly barrier-layer temperatures $T_j$ during breakdown operation, of a component 2.

Apparatus 1 may be used for recording reference measurement data for obtaining calibration curves, with an additional heating/cooling device further described below. The reference measurement data are intended to represent the correlation among breakdown voltage $U_d$, reverse current I and component temperature T, thus also temperature $T_j$ in the blocking-state region.

In accordance with this exemplary embodiment of the present invention, apparatus 1 according to FIG. 1 is used for measuring the reference measurement data.

An inductor 3 is charged via a switching device 4, e.g. a MOSFET transistor 4, for a specific time duration to a specific charge. This is represented in FIG. 1 by the square-wave pulse at the gate of MOSFET transistor 4. MOSFET transistor 4 has a higher breakdown voltage than the p-n junction of component 2 to be tested, in order to supply a sufficiently large charge for the breakdown of component 2. However, a breakdown voltage of an equal amount is sufficient.

After MOSFET transistor 4 is switched off, the energy stored in inductor 3 discharges via the p-n junction of component 2 shown in FIG. 1. Consequently, the voltage at the p-n junction of component 2 increases until the breakdown takes place and a discharging current I in the reverse direction, so-called reverse current I, flows off via the diode, i.e. component 2.

Figure 3:
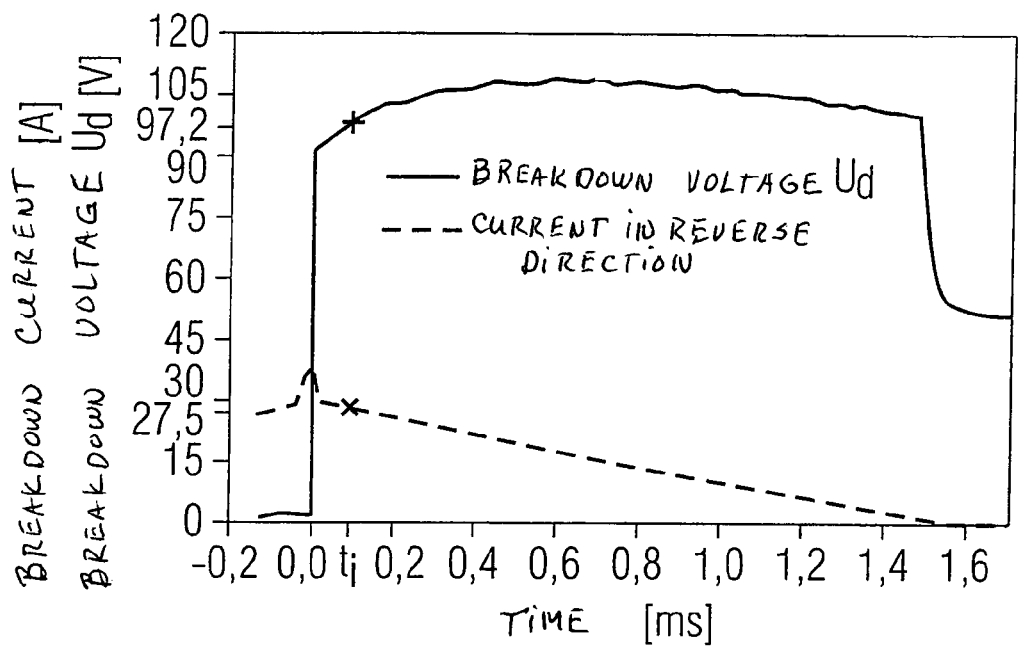
FIG. 3 is a graphic representation of the transient current characteristic and voltage characteristic during the breakdown operation according to the exemplary embodiment in FIG. 2.

Component 2 heats up due to the Joule heat given off by the current flow. However, reverse current I decays with time, as is shown in FIG. 3. Therefore, different temperature developments come about in the blocking-state region of component 2 during the breakdown characteristic. For recording the reference measurement data, it is necessary to measure the measured breakdown voltage $U_d$ and breakdown current I at component temperatures T which are constant, even in the blocking-state region.

A homogeneous component temperature T is achieved by heating or cooling the entire component using a heating/cooling plate. However, other methods, e.g. regulating component 2 to the desired temperature using a thermoflow, are also conceivable. The heating or cooling process is carried out for a specific period of time until a homogeneous temperature distribution of component 2 has ensued in such a way that desired barrier-layer temperature $T_j$ is present particularly in the blocking-state region at the p-n junction of component 2 to be tested.

To prevent influence of the Joule heat on the homogeneous temperature distribution in response to a flow of reverse current I during the breakdown operation of component 2, breakdown voltage $U_d$ and breakdown current I in the reverse direction are measured immediately after the breakdown of the p-n junction, i.e. 1 to 2 µs after the breakdown, for recording the reference measurement data. The steep rise of the voltage upon commencement of the breakdown may be used as the trigger signal for this measurement, the measurement being carried out at a specific, sufficiently brief point of time after the trigger signal.

Figure 2:
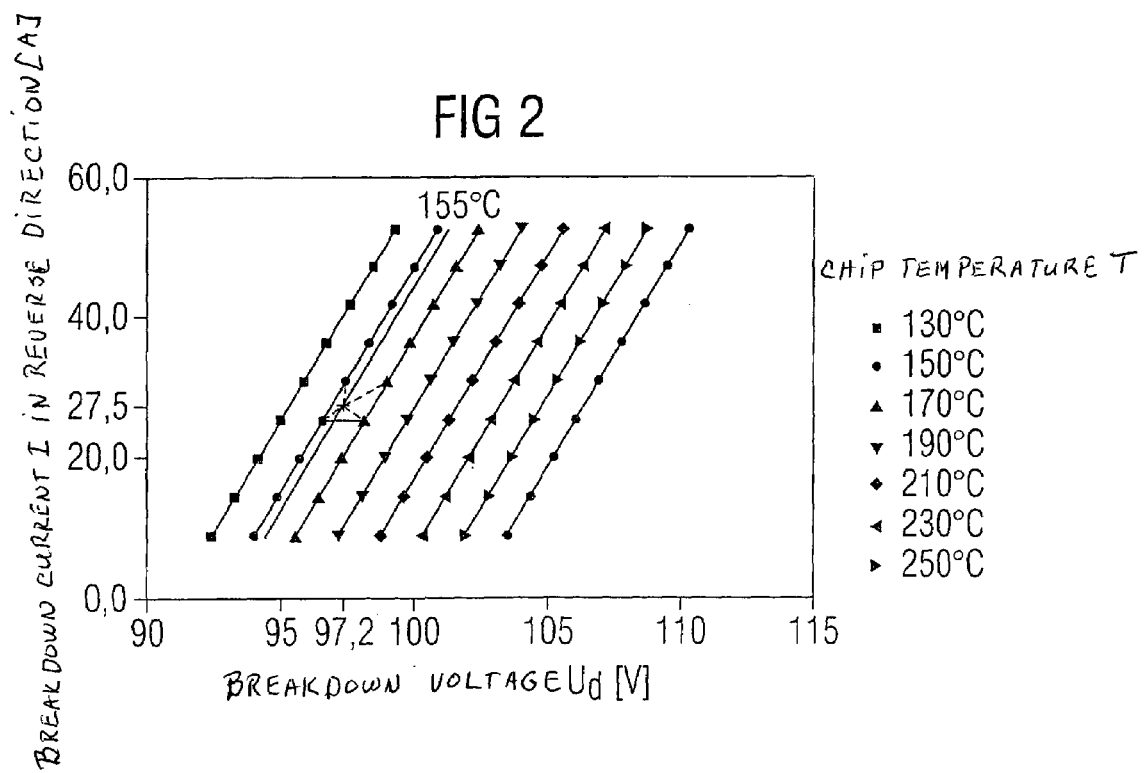
FIG. 2 is a graphic representation of breakdown characteristic curves $U_d$ v. (I) at different component temperatures T as reference measurement data according to an exemplary embodiment of the present invention.

Voltage value $U_d$ present at this point of time, given flowing reverse current I, yields a reference measuring point of calibration curve $U_d$ (I) shown in FIG. 2.

The measurement of the reference measurement data described above is repeated for various switch-on times of the gate voltage of MOSFET transistor 4. With increasing switch-on time, inductor 3 is charged more strongly, i.e. with a higher energy, by which current I flowing at the beginning of the breakdown may be adjusted accordingly.

By such variations of current I at the point of time of the breakdown, corresponding reference measurement data pairs ($U_d$, I) are obtained for each homogeneously set temperature T, thereby yielding, for example, a set of calibration curves shown in FIG. 2.

The circuit for determining calibration curves is to be dimensioned in a manner suitable for covering the current range necessary for the calibration. In order not to load component 2 too much, the discharge duration of inductor 3 may be designed to be as short as possible, for example, by using as small an inductor 3 as possible.

In addition, depending on the component or development stage, it may be expedient to determine a separate set of calibration curves for each individual component 2, or to use a single set of calibration curves representative of a complete component generation. In the latter case, it may possibly be sufficient to merely adjust individual smaller manufacturing tolerances by suitable scaling of the present set of calibration curves. For example, breakdown voltage $U_d$ of specific component 2 may be measured at at least one defined reference point (I, T), and the total set of calibration curves adapted to this reference point.

According to a further exemplary embodiment of the present invention, with reference to FIG. 1, it is possible to dispense with switching device 4, and instead, to use a field-effect transistor as the component 2 that is to be calibrated for charging inductor 3. According to this exemplary embodiment, the intrinsic body diode of field-effect transistor 2 exists as a p-n junction, and breaks down after the gate voltage is switched off.

After the reference-data measurement has concluded, the set of calibration curves shown in FIG. 2 is obtained which represents the correlation of breakdown voltage $U_d$ and breakdown current I in the reverse direction for predetermined component temperatures T or barrier-layer temperatures $T_j$. The spacings of predetermined temperatures T or $T_j$ are to be dimensioned in such a way, specific to the component and application, that respective barrier-layer temperature $T_j$ may be read accurately enough for the measurement described below.

FIG. 3 shows a graphic representation of a measurement of breakdown voltage $U_d$ and of breakdown current I as a function of time during the breakdown operation of component 2 according to an exemplary embodiment of the present invention.

Apparatus 1 according to FIG. 1 described above may be used for measuring barrier-layer temperatures $T_j$ during the breakdown operation of component 2. Only the heating/cooling device for heating or cooling component 2 is to be dispensed with in this case.

An oscilloscope (not shown) may be used as a measuring device for measuring breakdown voltage $U_d$ and breakdown current I.

In breakdown operation of component 2, the measuring device measures a value pair (breakdown voltage $U_d$, breakdown current I), from which associated barrier-layer temperature value $T_j$ may be ascertained using the set of calibration curves in FIG. 2.

In the following, the method described above shall be explained in greater detail, with the aid of FIGS. 2, 3 and 4, according to an exemplary embodiment of the present invention.

As shown in FIG. 3, the value pair represented by the two x's is measured at a point of time $t_i$ of approximately 0.09 ms, with breakdown voltage $U_d$ at point of time $t_i$ having a value of approximately 97.2 V and breakdown current I at point of time $t_i$ having a value of approximately 27.5 A.

As FIG. 2 shows, by comparing the value pair represented by "x" to the set of calibration curves depicted, especially to the two nearest breakdown characteristics, one obtains barrier-layer temperature $T_j$ existing at point of time $t_i$ in the blocking-state region of component 2 by interpolation of temperatures T of the calibration curves used.

Thus, in the present exemplary embodiment, at point of time $t_i$, for measured breakdown voltage $U_d$ and measured breakdown current I, one obtains a temperature $T_j$ of approximately 155° C. prevailing in component 2 in the blocking-state region, as is evident in FIG. 2. The two respective nearest reference measuring points of the two nearest calibration curves are advantageously used for the interpolation.

Figure 4:
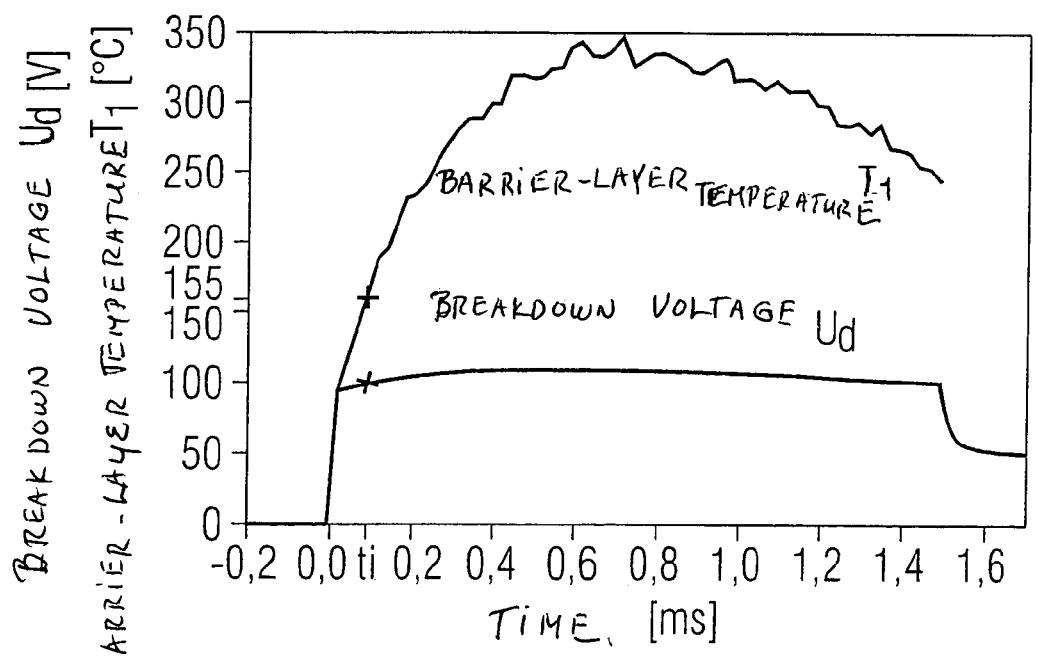
FIG. 4 is a graphic representation of the transient characteristic of barrier-layer temperature $T_j$ during a breakdown operation of the component according to the exemplary embodiment illustrated in connection with FIGS. 2 and 3.

The method described above may be repeated at each point of time $t_i$, by which the characteristic curve of barrier-layer temperature $T_j$ shown in FIG. 4 is obtained.

Although the present invention was described above in light of an exemplary embodiment, the invention is not restricted to it, but can be modified in diverse ways.

For example, a suitable software algorithm may be used for an automatic evaluation of the measurement data and indication of barrier-layer temperature $T_j$ prevailing at specific point of time $t_i$ in component 2.

The apparatus described above for plotting the set of calibration curves, as well as possible avalanche test circuits, may be integrated in a measuring apparatus which then automates the measurement-data acquisition and evaluation of the calibration curves. For example, a rapid processing unit may convert the measured values into a temperature curve online, which indicates transient barrier-layer temperature $T_j$ to the user in quasi real time during the component operation.

Since the barrier-layer temperature can only be evaluated during the breakdown of the p-n junction of the component, i.e. as long as a finite avalanche current I is flowing in the reverse direction, the forward voltage method known in the art may be used for plotting the further progression of the barrier-layer temperature after the avalanche current has decayed. In this manner, the decay of the temperature could then, for example, be further tracked on a longer time scale. Thus, it may possibly be advantageous to combine the known forward-voltage method and the breakdown-voltage method according to the present invention.

Moreover, the present invention may be used on all components having p-n-doped semiconductor junctions, e.g., transistors, diodes, etc., as well as on components capable of tunnel breakdown. Such components capable of tunnel breakdown may, for instance, be made up of two conductor layers separated from each other by an insulating layer, e.g., a gate oxide, it being possible for a tunnel breakdown to occur at the insulated junction between the two conductive layers and the insulating layer at a specific breakdown voltage.

Metal semiconductor components (e.g., Schottky diodes) capable of breakdown are also measurable using the method of the present invention.

The invention claimed is:

1. An apparatus for measuring an operating temperature of an electrical component during a breakdown operation, comprising:

an electrical storage device connected to the electrical component capable of electrical breakdown;

a switching device for charging the electrical storage device to a selected electrical charge, wherein, after the switching device is switched off, the electrical storage device discharges via the electrical component to switch the electrical component into a breakdown operation;

a measuring device for measuring a breakdown voltage characteristic and a breakdown current characteristic of the electrical component, wherein:

the electrical component is a semiconductor component with an electrical breakdown mode, the semiconductor component having at least one p-n junction, the electrical storage device is an inductor; and an evaluation unit that ascertains temperature variation of the electrical component based on the measured voltage characteristic and the measured current characteristic.

2. The apparatus according to claim 1, wherein the electrical component is a component with a tunnel breakdown mode, the electrical component having an insulating layer between two conductor layers.

3. The apparatus according to claim 1, wherein the switching device is a MOSFET switch.

4. The apparatus according to claim 1, wherein the electrical component is a Schottky diode.

5. The apparatus according to claim 1, wherein the measuring device is an oscilloscope.

6. The apparatus according to claim 1, wherein the electrical component is one of a MOSFET transistor, a bipolar transistor, and a diode.

7. The apparatus according to claim 6, wherein the electrical component is a MOSFET transistor, wherein the MOSFET transistor also functions as the switching device.

* * * * *